United States Patent
Kadoguchi

(10) Patent No.: US 9,502,326 B2
(45) Date of Patent: Nov. 22, 2016

(54) SEMICONDUCTOR DEVICE

(71) Applicant: TOYOTA JIDOSHA KABUSHIKI KAISHA, Toyota-shi, Aichi-ken (JP)

(72) Inventor: Takuya Kadoguchi, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/964,920

(22) Filed: Dec. 10, 2015

(65) Prior Publication Data

US 2016/0172266 A1  Jun. 16, 2016

(30) Foreign Application Priority Data

Dec. 11, 2014  (JP) ................. 2014-250778

(51) Int. Cl.
*H01L 23/34* (2006.01)
*H01L 23/367* (2006.01)
*H01L 23/373* (2006.01)

(52) U.S. Cl.
CPC ....... *H01L 23/3672* (2013.01); *H01L 23/3736* (2013.01)

(58) Field of Classification Search
CPC .............. H01L 23/3672; H01L 23/3736
USPC ........................................... 257/717
See application file for complete search history.

(56) References Cited

U.S. PATENT DOCUMENTS 8,836,110 B2 * 9/2014 Chopin ........... H01L 21/56
165/185
2014/0035112 A1  2/2014 Kadoguchi et al.

FOREIGN PATENT DOCUMENTS

| JP | 2000-357861 | 12/2000 |
|---|---|---|
| JP | 2003-124406 | 4/2003 |
| JP | 2007-88020 | 4/2007 |
| JP | 4020957 | 12/2007 |
| JP | 2012-235081 | 11/2012 |
| JP | 2013-16623 | 1/2013 |
| JP | 2015-126119 | 7/2015 |
| WO | WO 2015/097521 A2 | 7/2015 |

* cited by examiner

*Primary Examiner* — Tu-Tu Ho
(74) *Attorney, Agent, or Firm* — Finnegan, Henderson, Farabow, Garrett & Dunner, LLP

(57) ABSTRACT

A semiconductor device includes a transistor, a package in which the transistor is molded, a first heatsink plate, and a second heatsink plate. The first heatsink plate is bonded to a first surface of the package, and is fixed to one surface of the transistor in the package. The second heatsink plate is bonded to a second surface of the package so as to be opposed to the first heatsink plate, and is fixed to the transistor in the package. The second surface is opposite to the first surface. A bonded surface of the first heatsink plate with the plastic body includes a high stress area in which tensile stress equal to or higher than a predetermined stress value is generated. A plurality of grooves are provided in the high stress area.

5 Claims, 13 Drawing Sheets

Condition A  Groove Pitch : 0.2 [mm]
            Groove Depth:100 [μm]
Condition B  Groove Pitch : 0.2 [mm]
            Groove Depth: 50 [μm]
Condition C  Groove Pitch : 0.6 [mm]
            Groove Depth:100 [μm]

SEMICONDUCTOR DEVICE

CROSS-REFERENCE TO RELATED APPLICATION

This application claims priority to Japanese Patent Application No. 2014-250778 filed on Dec. 11, 2014, the contents of which are hereby incorporated by reference into the present application.

TECHNICAL FIELD

The present invention relates to a semiconductor device.

DESCRIPTION OF RELATED ART

A semiconductor device has been known which includes a semiconductor element, a plastic body in which the semiconductor element is embedded, and heatsink plates exposed on both surfaces, respectively, of the plastic body. Examples of such semiconductor devices are disclosed in Japanese Patent Application Publication, *Tokukai*, No. 2012-235081A and Japanese Patent Application Publication, *Tokukai*, No. 2013-016623A. The heatsink plates are bonded to the body, and are fixed to the semiconductor element in the body.

BRIEF SUMMARY OF INVENTION

There is a case where in order to enhance the bondability between a body and a heatsink plate, a primer is applied to the heatsink plate before the heatsink plate is bonded to the body. The primer is an undercoat composed mainly, for example, of polyamide resin. The body and the heatsink plate are bonded to each other via the primer. However, if the primer has an uneven thickness, the primer exerts unequal bonding force, which may cause the heatsink plate to be detached from the body at a place where the bonding force is insufficient. The present specification provides a technology for suppressing the detachment of a heatsink plate from a body by compensating for a reduction in boding force due to a thinning of a primer.

A semiconductor device disclosed herein includes a semiconductor element, a body, a first heatsink plate, and a second heatsink plate. The body is a plastic body in which the semiconductor element is embedded. The first heatsink plate is bonded to a first surface of the plastic body, and is fixed to the semiconductor element in the plastic body. The second heatsink plate is bonded to a second surface of the plastic body so as to be opposed to the first heatsink plate. The second surface is opposite to the first surface. The second heatsink plate is fixed to the semiconductor element in the plastic body. Either or both of the first and second heatsink plates may be fixed directly to the semiconductor element, or may be fixed to the semiconductor element via another member(s) such as a metal spacer(s) (or metal block(s)). In this semiconductor device, furthermore, a bonded surface of the first heatsink plate with the plastic body includes a high stress area, the high stress area has a possibility of generating tensile stress equal to or higher than a predetermined stress value, and a plurality of grooves, a plurality of protrusions, or both of the plurality of grooves and the plurality of protrusions are provided in the high stress area.

The inventor of the present application studied and found that in the case of a semiconductor device including a semiconductor element, a body, and heatsink plates bonded to both surfaces, respectively, of the body and fixed to the semiconductor element in the body, stress that is generated at the boundary between the body and each of the heatsink plates is not uniform and has a particular profile in a cross-section crossing the heatsink plates and the body. In particular, at the boundary between the body and each of the heatsink plates, there is an area where tensile stress is generated and an area where compressive stress is generated. In an area where the tensile stress is low and an area where compressive stress is generated, there may be a small possibility of occurring a detachment. Therefore, in the semiconductor device disclosed herein, a bonded surface of the first heatsink plate with the plastic body includes a high stress area, the high stress area has a possibility of generating tensile stress equal to or higher than a predetermined stress value, and a plurality of grooves or a plurality of protrusions are provided in the high stress area. The plurality of grooves or the plurality of protrusions increase the area of bonding between the heatsink plates and the body and thus increase the bonding force. As a result, the detachment of the heatsink plates from the body is prevented. Note that both of the plurality of grooves and the plurality of protrusions may be provided. Details of the technology disclosed herein and further improvements thereto are described in section "DETAILED DESCRIPTION OF INVENTION" below.

DETAILED DESCRIPTION OF INVENTION

Figure 1:
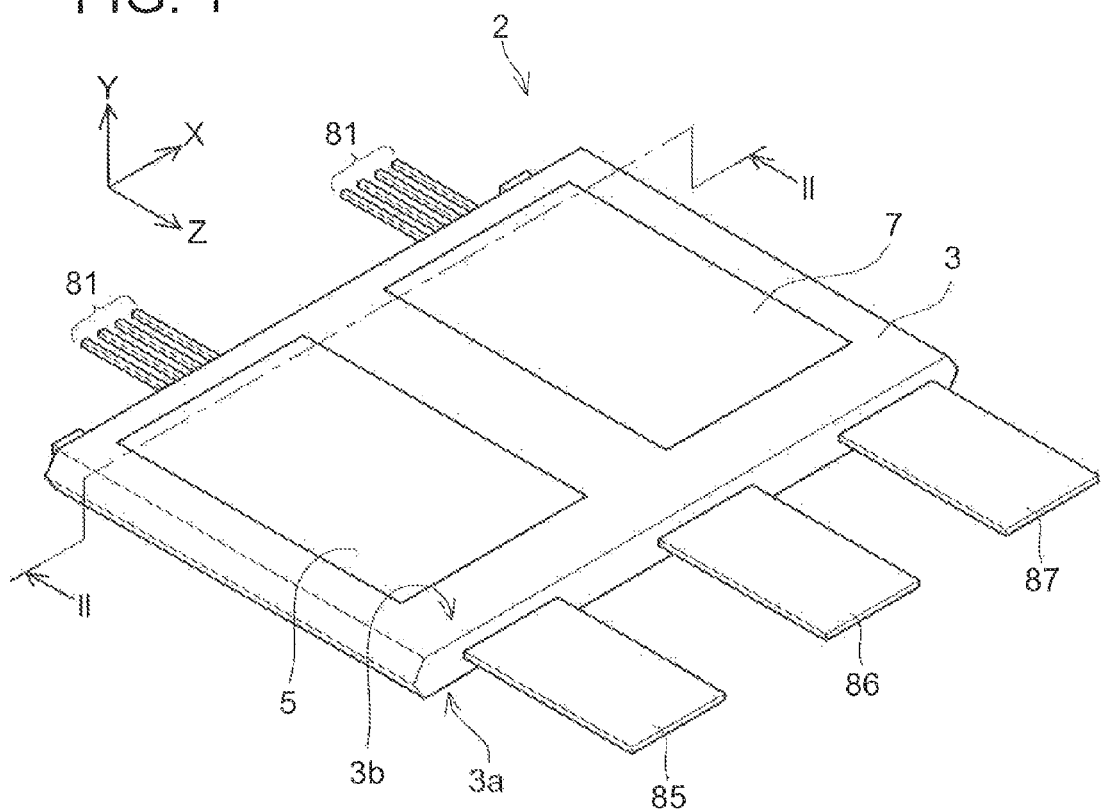
FIG. 1 is a perspective view of a semiconductor device according to an embodiment.

A semiconductor device 2 according to an embodiment is described with reference to the drawings. FIG. 1 is a perspective view of the semiconductor device 2. The semiconductor device 2 is a device including four power semiconductor elements and a plastic package 3 in which the four power semiconductor elements are embedded. The package 3 is a flat plate package on the two widest flat surfaces of which heatsink plates are exposed, respectively. For convenience of explanation, the two widest flat surfaces of the flat plate package 3 are hereinafter referred to as "principal flat surfaces 3a and 3b", respectively. Extending from either side surface (which intersects with the principal flat surfaces) of the package 3 are terminals 81, 85, 86, and 87 electrically connected to the semiconductor elements in the package 3.

Figure 2:
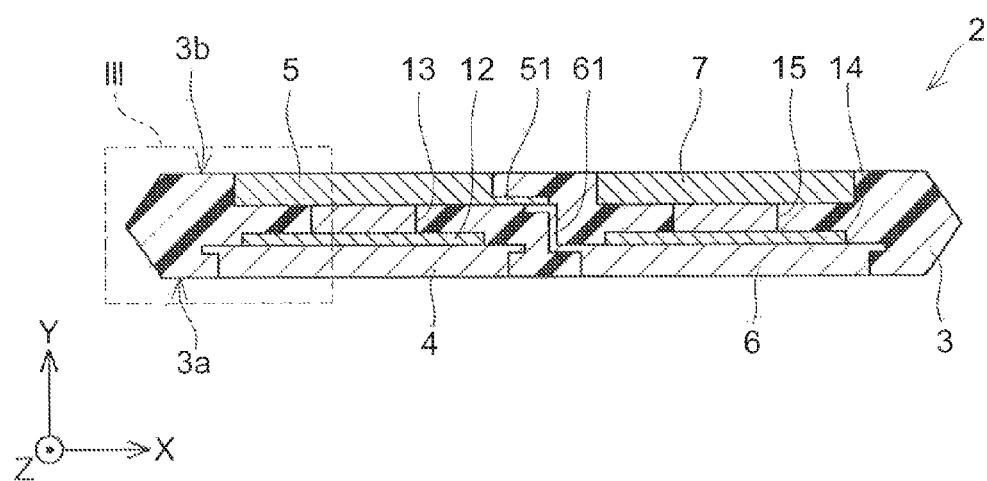
FIG. 2 is a cross-sectional view taken along the line II-II in FIG. 1.
Figure 3:
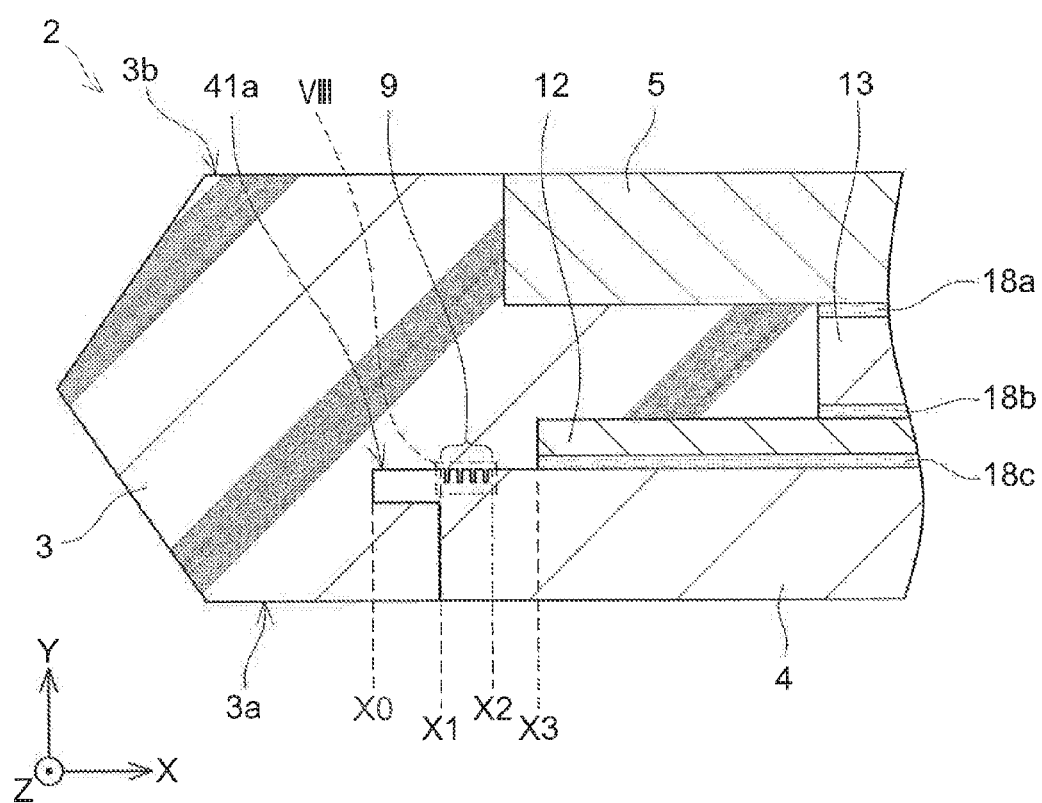
FIG. 3 is an enlarged cross-sectional view of a range indicated by the dashed line III in FIG. 2.

FIG. 2 is a cross-sectional view of the semiconductor device 2 as taken along the line II-II in FIG. 1. As mentioned above, the four semiconductor elements are embedded in the package 3. Two elements (transistors 12 and 14) of the four semiconductor elements are shown in the cross-section of FIG. 2. The remaining two elements are diodes embedded in different locations in a Z-axis direction on a coordinate system in the drawing. The two diodes will be described later. FIG. 3 is an enlarged view of a dashed-line rectangular portion indicated by the sign III in FIG. 2.

As shown in FIG. 2, the transistors 12 and 14 (and the two diodes) are embedded in the package 3. Heatsink plates 4 and 6 are exposed on one of the principal flat surfaces, namely the principal flat surface 3a, of the package 3. Heatsink plates 5 and 7 are exposed on the other of the principal flat surfaces, namely the principal flat surface 3b, of the package 3. The heatsink plates 4 and 5, the transistor 12, and a spacer 13 are stacked in a direction across the principal flat surfaces 3a and 3b. One surface of the heatsink plate 4 is exposed from the package 3. A part of the other surface of the heatsink plate 4 is bonded to the package 3, and the remaining part of the other surface of the heatsink plate 4 is bonded to the transistor 12. The heatsink plate 4 and the transistor 12 are bonded to each other via a bonding layer 18c (see FIG. 3). The bonding layer 18c is a layer of solder. The transistor 12 and the spacer 13 are bonded to each other via a bonding layer 18b, and the spacer 13 and the heatsink plate 5 are bonded to each other via a bonding layer 18a (see FIG. 3). The bonding layers 18a and 18b are layers of solder. The heatsink plates 6 and 7, the transistor 14, and a spacer 15 are also stacked in a direction across the principal flat surfaces 3a and 3b. One surface of the heatsink plate 6 is exposed from the package 3. A part of the other surface of the heatsink plate 6 is bonded to the package 3, and the remaining part of the other surface of the heatsink plate 6 is bonded to the transistor 14. The transistor 14 and the spacer 15 are bonded to each other, and the spacer 15 and the heatsink plate 7 are bonded to each other. The package 3 seals in the transistor 12 (and the after-mentioned diode 16) between the pair of heatsink plates 4 and 5. The package 3 also seals in the transistor 14 (and the after-mentioned diode 17) between the pair of heatsink plates 6 and 7.

The heatsink plates 4, 5, 6, and 7 and the spacers 13 and 15 are made of copper. Each of the transistors 12 and 14 is a flat plate transistor on both surfaces of which electrodes are exposed, respectively. The electrode plates are surrounded by plastic. The heatsink plate 4 is electrically connected to one of the electrodes of the transistor 12, and the heatsink plate 5 is electrically connected to the other of the electrodes of the transistor 12. The heatsink plate 6 is electrically connected to one of the electrodes of the transistor 14, and the heatsink plate 7 is electrically connected to the other of the electrodes of the transistor 14.

In the package 3, the heatsink plate 5 has a joint part 51 extending from an edge of the heatsink plate 5 and the heatsink plate 6 has a joint part 61 extending from an edge of the heatsink plate 6. In the package 3, the joint part 51 of the heatsink plate 5 and the joint part 61 of the heatsink plate 6 are connected to each other. This allows the transistor 12 and the transistor 14 to be connected in series to each other. The heatsink plate 4 and the heatsink plate 7 correspond to terminals at both ends of the serial connection of the two transistors 12 and 14, and the heatsink plate 5 and the heatsink plate 6 correspond to middle points in the serial connection of the two transistors 12 and 14. As will be described later with reference to FIG. 4, the terminal 85 shown in FIG. 1 continues into the heatsink plate 4, and the terminal 87 shown in FIG. 1 continues into the heatsink plate 6. Although not illustrated, the heatsink plate 7 and the terminal 86 are electrically connected to each other in the package 3.

Figure 4:
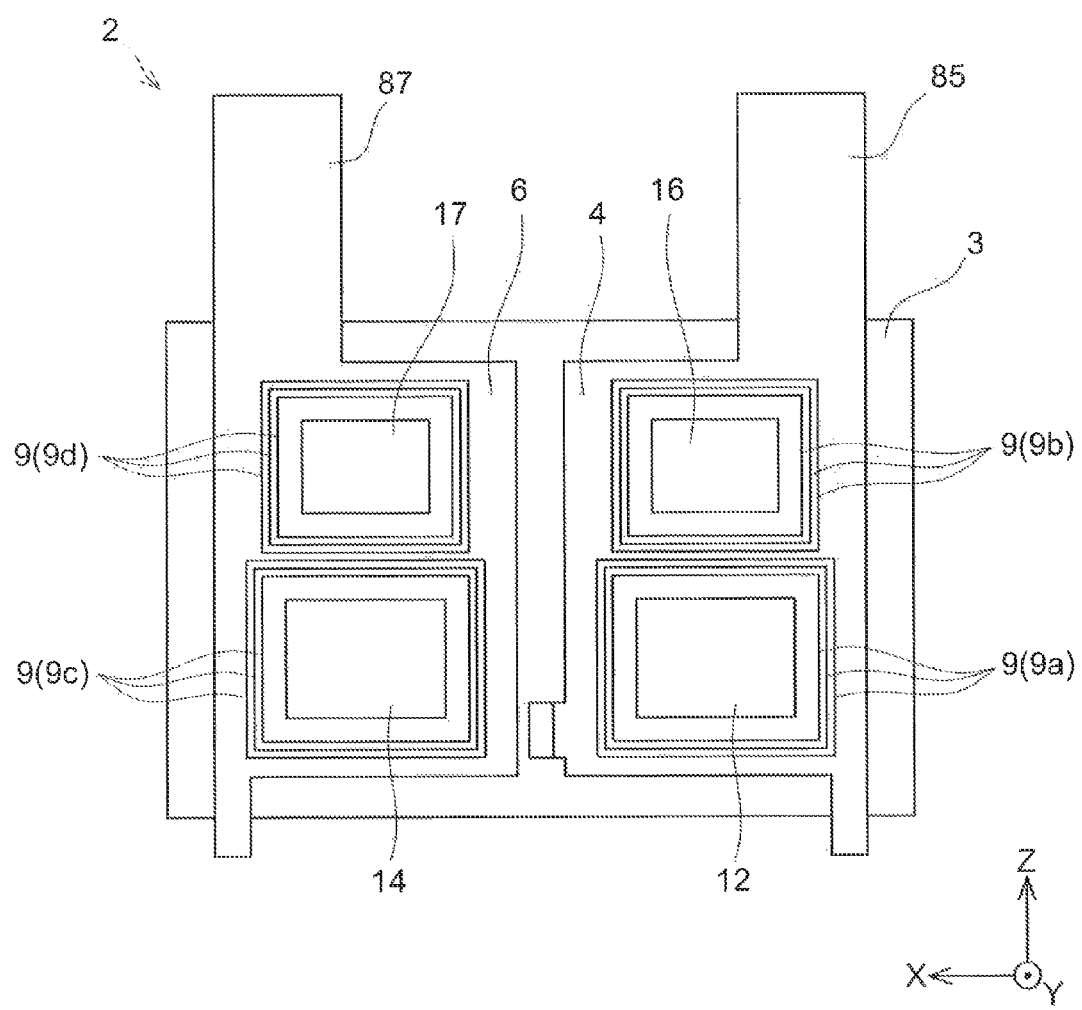
FIG. 4 is a plan view of the semiconductor device (excluding the upper heatsink plates and the spacers)

As shown in FIG. 3, a plurality of grooves 9 are provided in a particular area on a package-facing surface 41a of the heatsink plate 4 that is bonded to the package 3. The particular area is the after-mentioned high stress area. The plurality of grooves provided in the heatsink plate 4 (and the heatsink plate 6) will be described. FIG. 4 is a plan view of the semiconductor device 2. To help easy comprehension of a structure in the package 3, FIG. 4 shows only the contours of the package 3. Further, FIG. 4 excludes the heatsink plates 5 and 7 and the spacers 13 and 15 (see FIG. 2). Further, to help easy comprehension, FIGS. 3 and 4 illustrate the plurality of grooves 9 with their sizes emphasized. That is, it should be noted that FIGS. 3 and 4 do not accurately represent the relative sizes of the grooves 9 with respect to the semiconductor device 2. The sizes of the grooves will be described later.

The diode 16, as well as the transistor 12, is bonded to the heatsink plate 4. The diode 17, as well as the transistor 14, is bonded to the heatsink plate 6. As stated earlier, a plurality of grooves 9 (9a) are provided in the surface of the heatsink plate 4 that is bonded to the package 3, and the plurality of grooves 9a are provided so as to surround the transistor 12 in a plan view of the heatsink plate 4. The plurality of grooves 9a extend parallel to each other, and surround the transistor 12 in a concentric fashion. Another plurality of grooves 9 (9b) are provided in the surface of the heatsink plate 4 that is bonded to the package 3, and the plurality of grooves 9b are provided so as to surround the transistor 16 in the plan view of the heatsink plate 4. The plurality of grooves 9b extend parallel to each other, and surround the transistor 16 in a concentric fashion. The same applies to the heatsink plate 6. That is, a plurality of grooves 9 (9c) are provided in a surface of the heatsink 6 that is bonded to the package 3, and the plurality of grooves 9c are provided so as to surround the transistor 14 in a plan view of the heatsink plate 6. Further, another plurality of grooves 9 (9d) are provided in the surface of the heatsink 6 that is bonded to the package 3, and the plurality of grooves 9d are provided so as to surround the diode 17 in the plan view of the heatsink plate 6. The plurality of grooves 9c extend parallel to each other, and surround the transistor 14 in a concentric fashion. The plurality of grooves 9d extend parallel to each other, and surround the diode 17 in a concentric fashion. The terminal 85 extends from an edge of the heatsink plate 4 toward the outside of the package 3 (see FIG. 1). The terminal 87 extends from an edge of the heatsink plate 6 toward the outside of the package 3.

The plurality of grooves 9 (9a, 9b, 9c, and 9d) are described. The following description is given with continued reference to FIG. 3. Further, the following description is given by taking, as an example, the plurality of grooves 9 (9a) provided so as to surround the transistor 12. The plurality of grooves 9 are provided so as to improve the bonding force between the heatsink plate 4 and the package 3. A reason for this is as follows. The package 3 is made by injection molding after the heatsink plates 4, 5, 6, and 7, the spacers 13 and 15, and the semiconductor elements (i.e. the transistors 12 and 14 and the diodes 16 and 17) have been bonded. Before the package 3 is molded, a primer is applied to a surface of the assembly of the heatsink plates, the spacers, and the semiconductor elements. The primer is a undercoat composed mainly, for example, of polyamide resin, and improves the bondability between metals such as the heatsink plates and the package. However, it is difficult to apply the primer with uniform thinkness. The primer becomes thicker in places at corners, such as boundary portions between the heatsink plate 4 and the transistor 12, and becomes gradually thinner toward an edge of the heatsink plate. Meanwhile, when, as shown in FIG. 3, the plastic package 3 is sandwiched between two metal plates (i.e. the heatsink plates 4 and 5) and the metal plates (i.e. the heatsink plates 4 and 5) are bonded in the package, expansion of the plastic package 3 causes stress having a unique profile to be generated at the bonded surface of each of the metal plates (i.e. the heatsink plates 4 and 5) with the package 3. Note that expansion of the package is caused by a rise in temperature of the package 3 or a rise in moisture content of the package 3.

Figure 5:
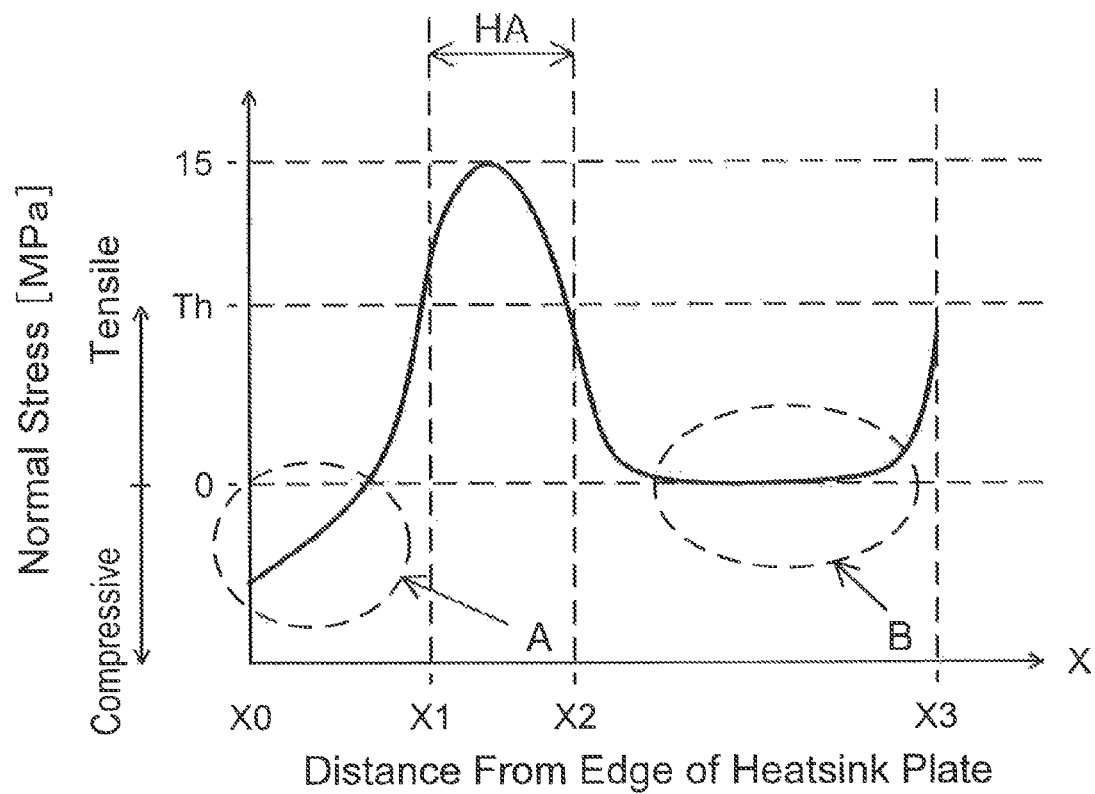
FIG. 5 is a graph of a profile of stress that is generated between the position X0 and the position X3 in FIG. 3.

FIG. 5 shows an example of a stress profile. In FIG. 5, the horizontal axis represents the distance from the edge of the heatsink plate 4 in FIG. 3 to the bonding place where the heatsink plate 4 and the transistor 12 are bonded to each other in FIG. 3. The position X0 represents the left-end edge of the heatsink plate 4 in FIG. 3, and the position X3 represents the left end of the bonding portion where the heatsink plate 4 and the transistor 12 are bonded to each other in FIG. 3. In FIG. 5, the vertical axis represents the magnitude of normal stress that is generated on the surface of the heatsink plate 4. The positive value of the vertical axis means tensile stress, and the negative value of the vertical axis means compressive stress. As clearly shown in FIG. 5, the tensile stress becomes higher in a particular area on the heatsink plate 4, i.e. in an area extending from X1 to X2 in FIG. 5. This area is hereinafter referred to as "high stress area HA". In the example shown in FIG. 5, the high stress area HA is defined as an area in which the stress (tensile stress) is equal to or higher than a threshold value Th. The tensile strength becomes gradually lower on a side closer to the edge than the high stress area HA (i.e. on the left; side of the graph), and furthermore, the magnitude of the tensile stress takes on a negative value. That is, the compressive stress acts in the vicinity of the edge of the heatsink plate 4 (i.e. in a place indicated by the sign A in FIG. 5). Further, the tensile stress becomes rapidly smaller on a side closer to the element than the high stress area (i.e. on the right side of the drawing that is close to the transistor 12), and continues to be in a range of substantially 0 (i.e. a place indicated the sign B in FIG. 5). The tensile stress becomes slightly higher at the boundary (position X3) between the element (transistor 12) and the package 3.

Stress that is generated in the heatsink plate 4 has such a profile as that shown in FIG. 5, and makes it easier for the heatsink plate 4 to be detached from the package 3 in the high stress area HA. The stress profile spreads into a belt shape to surround the element (transistor 12) in the plan view of the heatsink plate 4. Therefore, in the semiconductor device 2, the plurality of grooves 9 are provided in the high stress area HA to improve the bonding force between the heatsink plate 4 and the package 3. The plurality of grooves 9 increases the area of bonding between the heatsink plate 4 and the package 3 and thus increases the bonding force between the heatsink plate 4 and the package 3. As stated earlier, the stress profile spreads into a belt shape to surround the demerit (transistor 12) in the plan view of the heatsink plate 4. The area in which the plurality of grooves 9a are provided in the plan view of FIG. 4 corresponds to the high stress area HA.

As shown in FIG. 4, the plurality of grooves 9b surrounding the diode 16, as well as the plurality of grooves 9a surrounding the transistor 12, are provided in the heatsink plate 4. Further, the plurality of grooves 9c surrounding the transistor 14 and the plurality of grooves 9d surrounding the diode 17 are provided, in the heatsink plate 6. As with the plurality of grooves 9a, the plurality of grooves 9b, 9c, and 9d are provided in high stress areas. In other words, the areas in which the plurality of grooves 9a, 9b, 9c, and 9d are provided in the plan view of FIG. 4 correspond to the high stress areas.

The semiconductor device 2 includes the plurality of grooves 9 in the surfaces of the heatsink plates 4 and 6 that are bonded to the package 3. The plurality of grooves 9 are provided in the high stress area HA, where tensile stress that is generated in the heatsink plates 4 and 6 is equal to or higher than a predetermined stress value. (i.e. the threshold value Th shown in FIG. 5). Profiles of stress that is generated in the heatsink plates 4 and 6 can be obtained, for example, by stress analyses (including simulations). Conditions for determination of the threshold value Th can be set as appropriate. Examples of the conditions are: the material and the size of each component of the semiconductor device 2, the maximum temperature that the package 3 can reach in the environment where the package 3 is used, the amount of moisture (size of a region containing moisture) that the package 3 can contain in the environment where the package 3 is used, and the like.

Grooves for enhancing the bonding force between the package 3 and heatsink plates may be provided in the heatsink plates 5 and 7 on the other side of the principal flat surfaces, namely the principal flat surface 3b, of the package 3. Instead of the plurality of grooves, a plurality of projections may be provided in the heatsink plates. Alternatively, both of the plurality of grooves and the plurality of projections may be provided in the heatsink plates. It is desirable that the plurality of grooves or the plurality of projections surround the semiconductor elements (i.e. the transistors 12 and 14 and the diodes 16 and 17) in a concentric fashion. However, instead of the plurality of grooves surrounding the semiconductor elements, a plurality of grooves that are short in length, i.e. a plurality of depressions, may be provided in the high stress area. Alternatively, instead of the plurality of projections surrounding the semiconductor elements, a plurality of protrusions may be provided in the high stress area.

Figure 6:
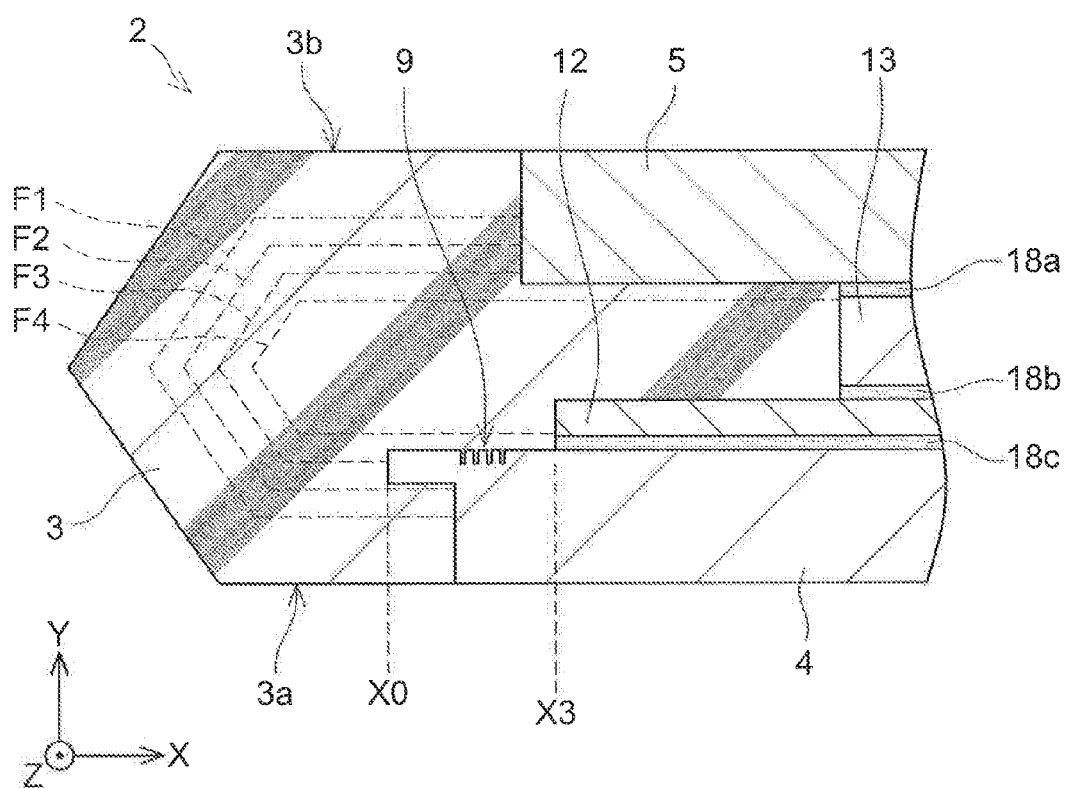
FIG. 6 is an enlarged cross-sectional view of the semiconductor device.
Figure 7:
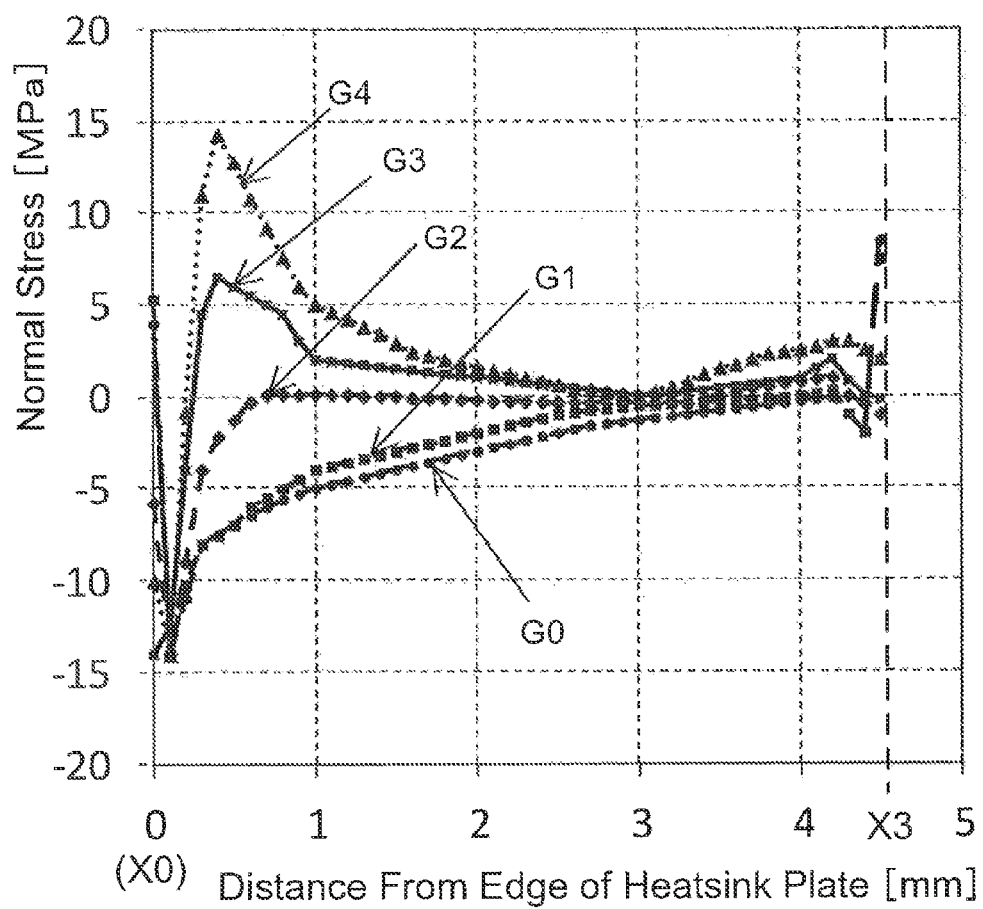
FIG. 7 is a graph showing results of simulations of stress profiles with varying moisture-containing regions of a package.

Next, differences in stress profile due to differences in moisture-containing region of the package 3 are shown with reference to FIGS. 6 and 7. FIG. 6 shows the same cross-section as FIG. 3. FIG. 6 shows four dashed lines F1 to F4. Each of these four dashed lines F1 to F4 indicates a line at a certain depth from a surface of the package 3. The dashed line F1 is a line at a depth of 0.9 [mm] from the surface of the package 3. The dashed line F2 is a line at a depth of 1.6 [mm] from the surface of the package 3. The dashed line F3 is a line at a depth of 1.8 [mm] from the surface of the package 3. The dashed line F4 is a line at a depth of 2.2 [mm] from the surface of the package 3.

The package 3, which is made of resin, expands when it contains moisture. Expansion due to moisture content is much larger in the plastic package 3 than in the heatsink plate 4 which is made of a metal plate. Therefore, stress that is generated due to moisture content is greater than stress that is generated between the heatsink plate 4 and the package 3 due to a rise in temperature. Stresses that are generated in the heatsink plate 4 due to moisture content were analyzed.

FIG. 7 shows results of simulations of profiles of stress generated when moisture has permeated into the depths indicated by the dashed lines F1 to F4, respectively. In FIG. 7, the horizontal axis represents the distance from the edge of the heatsink plate 4. The left end of the horizontal axis corresponds to the edge of the heatsink plate 4. The edge of the heatsink plate 4 is located in a position indicated by the sign X0 in FIG. 6. The right end of the horizontal axis corresponds to the boundary between the package 3 and the transistor 12. The boundary between the package 3 and the transistor 12 is located in a position indicated by the sign X3 in FIG. 6. The position X3 is 4.5 [mm] away from the position X0. In FIG. 7, the vertical axis represents normal stress that is generated on the surface of the heatsink plate 4. As with the case of FIG. 5, the positive value of the vertical axis means tensile stress, and the negative value of the vertical axis means compressive stress.

The line G0 indicates a profile of stress generated when the package 3 contains no moisture at all. The line G1 indicates a profile of stress generated when the package 3 contains moisture down to the depth of the dashed line F1 from the surface of the package 3. The lines G2 to G4 indicates profiles of stress generated when the package 3 contains moisture down to the depths of the dashed lines F2 to F4 from the surface of the package 3, respectively. As clearly shown in FIG. 7, the tensile stress takes on a greater maximum value when moisture is contained at a greater depth. However, compressive stress is always generated in the vicinity of the edge of the heatsink plate 4 (i.e. in the vicinity of the position X0), and the tensile stress is almost flat in the vicinity of zero from the middle of the heatsink plate 4 to the vicinity of the boundary between the package 3 and the transistor 12 (i.e. the vicinity of the position X3) along the X axis. Thus, even with varying depths at which moisture is contained, the stress profiles show curves having characteristic contours. These stress profiles show that it is desirable, for the prevention of detachment, that in a belt-shaped range located between a position 1 and a position 2 the plurality of grooves surrounding the semiconductor element be provided. The position 1 locates from the edge of the heatsink plate 4 with a predetermined width and the position 2 locates from the semiconductor element (such as the transistor 12 or the diode 16) with another predetermined width.

Figure 8:
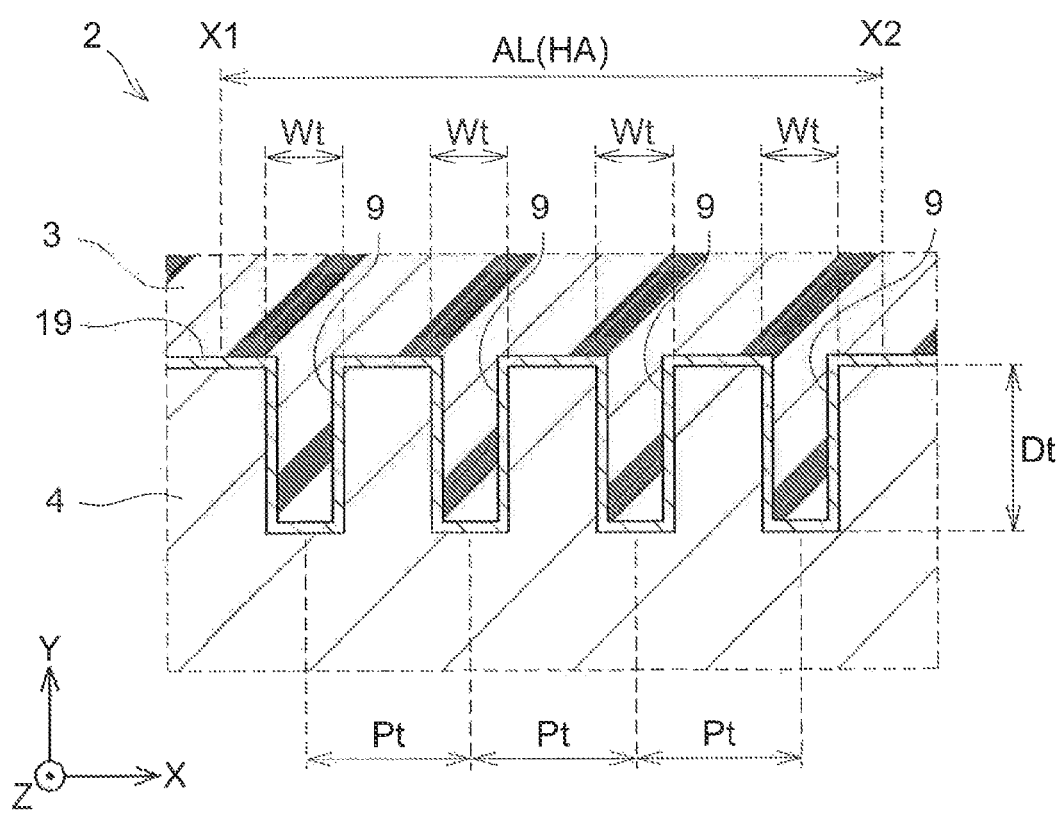
FIG. 8 is an enlarged view of a region indicated by the sign VIII in FIG. 2.

Next, a relationship between the shapes of the grooves 9 and the strength of bonding force is explained with reference to FIGS. 8 to 12. FIG. 8 is an enlarged view of an arc surrounded by a dashed-line rectangle indicated by the sign VIII in FIG. 3. The plurality of grooves 9 extend parallel to each other at pitches Pt from each other. The depth of each of the grooves 9 is represented by the sign Dt. Further, the width of each of the grooves 9 is represented by the sign Wt. The range between X1 and X2 in the drawing corresponds to the aforementioned high stress area HA, and the sign AL in FIG. 8 represents the distance between the position X1 and the position X2, i.e. the width of the high stress area HA. Note that a primer 19 has been applied to the surface of the heatsink plate 4 that includes side and bottom surfaces of each of the grooves 9. It should be noted that FIG. 8 does not accurately represent the sizes of the grooves 9, either. It should also be noted that the number of grooves 9 is not limited to four.

The high stress area HA spreads into a constant-width belt shape around the transistor 12, and the plurality of grooves 9 extend parallel to each other in the belt shape. Therefore, the ratio of the total of groove widths Wt (groove width Wt×number of grooves) to the width AL of the high stress area HA corresponds to the ratio of the total area of the grooves to the area of the high stress area HA. The strengths of bonding force with changing this area ratio will be described later.

The strength of bonding force by the plurality of grooves 9 shown in FIG. 8 was evaluated with use of test pieces. FIGS. 9 to 12 show results obtained by preparing test pieces in each of which a metal plate imitating the heatsink plate 4 and a plastic block imitating the package 3 has been bonded to each other under the same conditions as in the semiconductor device 2 and testing the test pieces with a tensile tester. A plurality of grooves are provided in the bonded surface of the metal plate with the plastic block. The plurality of grooves 9 imitate the plurality of grooves 9 of the semiconductor device 2. The metal plate is made of copper. Further, two types of test pieces were used in testing: a test piece in which a copper plate having a nickel-plated surface is used and a test piece in which a non-nickel-plated copper plate having an uncoated surface is used. These types of test pieces are both subjected to a plastic curing step. In the following, a test piece subjected to nickel plating is referred to as "nickel test piece", and a test piece without a coating is referred to as "uncoated test piece".

FIGS. 9 to 12 are graphs whose vertical axes represent tensile strength. The term "tensile strength" means the stress under which a test piece breaks.

Figure 9:
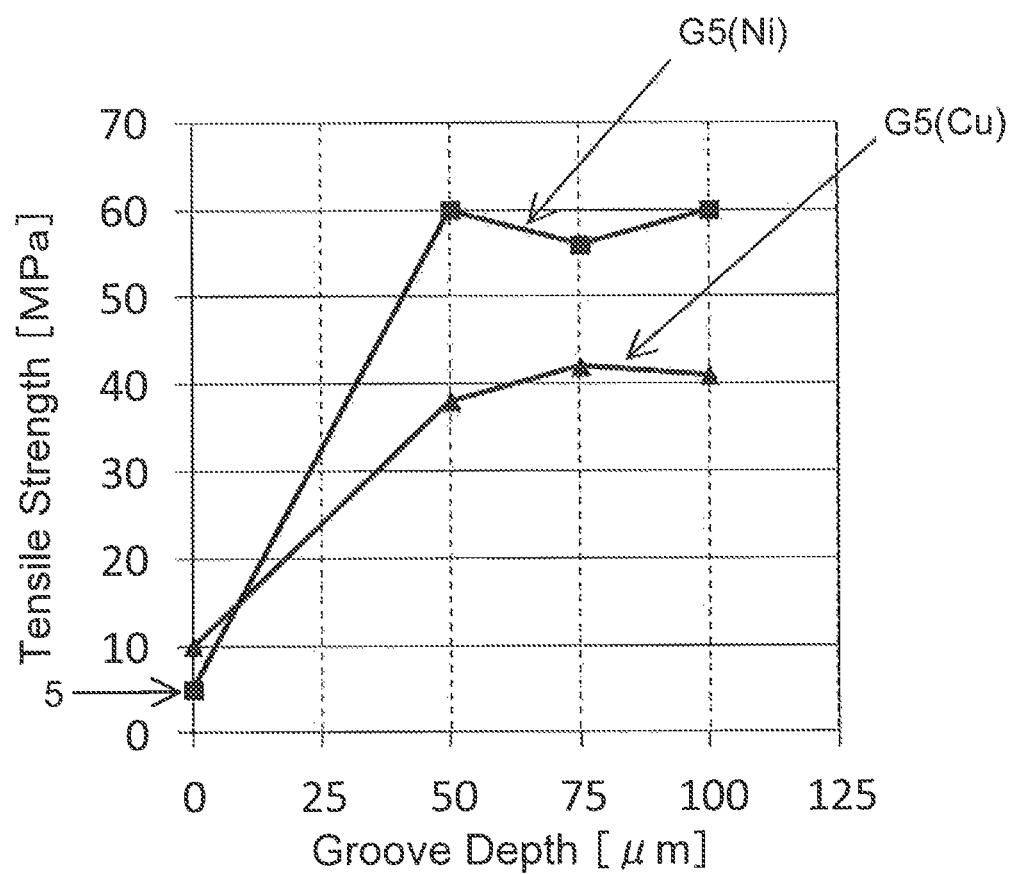
FIG. 9 is a graph showing an example of a relationship between groove depth and tensile strength.

FIG. 9 is a graph showing an example of a relationship between groove depth and tensile strength. Tests were conducted on three types of groove depth: Dt=50 [μm], 75 [μm], and 100 [μm]. The grooves were formed by laser processing. In each of the tests, the pitch Pt between grooves was 0.2 [mm], and the temperature was 25 [° C.]. The line G5 indicates the results of the tests conducted on nickel test pieces, and the line G6 indicates the results of the tests conducted on uncoated test pieces. At each groove depth, the nickel test pieces are higher in tensile strength than the uncoated test pieces by about 20 [MPa]. Each of the test pieces had a tensile strength of 30 [MPa] or higher. It is estimated that in the case of a groove depth of 0 (i.e. in a case where no grooves are provided), a nickel test piece breaks at about 5 [MPa] and an uncoated test piece breaks at about 10 [MPa]. It is desirable that the heatsink plate be made of a copper material without a coating or a copper material having a nickel-plated surface. These results show that when the heatsink plate is made of a copper material without a coating, an appropriate threshold value Th of stress for defining the high stress area HA in which to provide the grooves is 10 [MPa] and that when the heatsink plate is made of a copper material having a nickel-plated surface, an appropriate threshold value Th of stress for defining the high stress area HA in which to provide the grooves is 5 [MPa].

Further, the FIG. 9 shows a result that a tensile strength of 20 [MPa] can be ensured if the groove depth is equal to or greater than 25 [μm] including an estimate value. Further, although not shown in FIG. 9, the tensile strength becomes substantially constant when the groove depth exceeds 100 [μm]. These results show that it is preferable that the groove depth be equal to or greater than 25 [μm] and equal to or less than 100 [μm].

Figure 10:
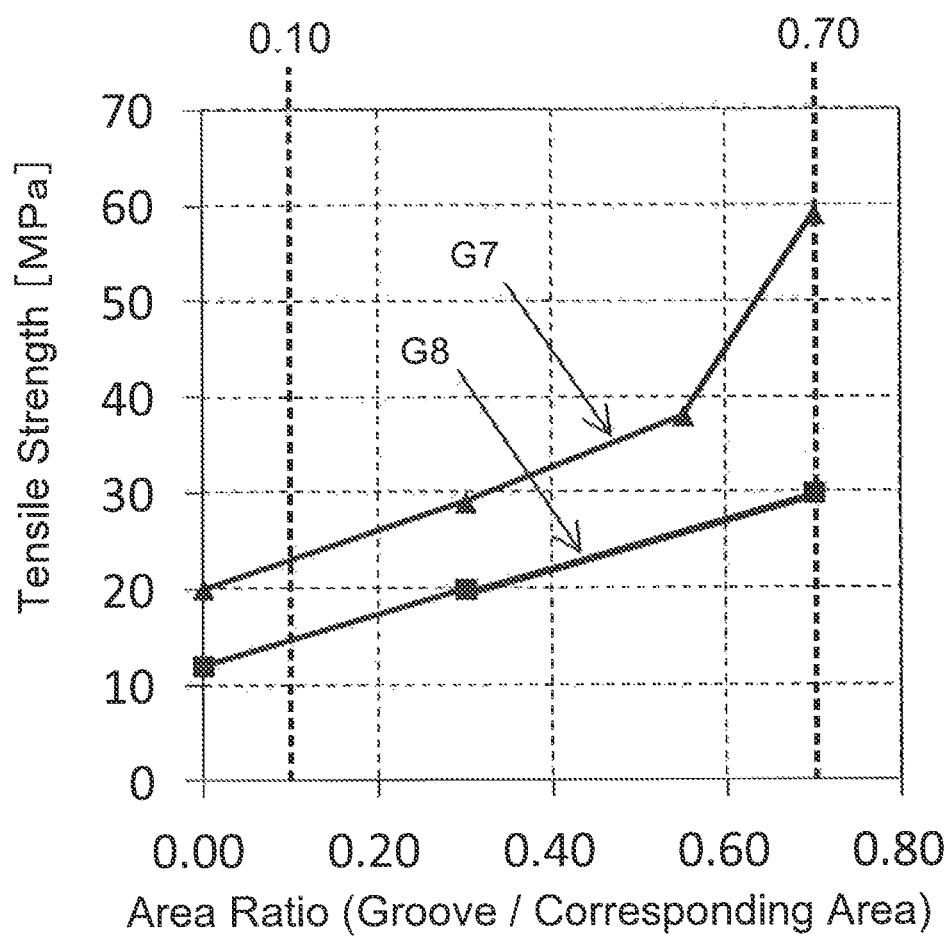
FIG. 10 is a graph showing an example of a relationship between the area ratio of grooves to a high stress area and tensile strength.

FIG. 10 is a graph showing an example of a relationship between the ratio (area ratio) of the total area of the grooves to the area of the high stress area HA and tensile strength.

The area ratio has already been described above with reference to FIG. 8. The graph of FIG. 10 is a graph made by conducting tests on several nickel test pieces with varying area ratios and approximating the results with broken lines. The groove depth is 100 [μm]. The line G7 is a line of approximation of test results obtained at a temperature of 25 [° C.], and the line G8 is a line of approximation of test results obtained at a temperature of 180 [° C.]. In the area ratio range of 0.30 (30%) and lower, lines extend from the lines of approximation means an estimation. It is when the area ratio is in a range of 0.1 and higher that the tensile strength is equal to or higher than 20 [MPa] at a temperature of 25 [° C.] and the tensile strength is 10 [MPa] at a temperature of 180 [° C.]. The results shown in FIG. 10 show that it is preferable that the ratio of the total area of the grooves to the area of the high stress area HA be equal to or higher than 0.10 and equal to or lower than 0.70.

Figure 11:
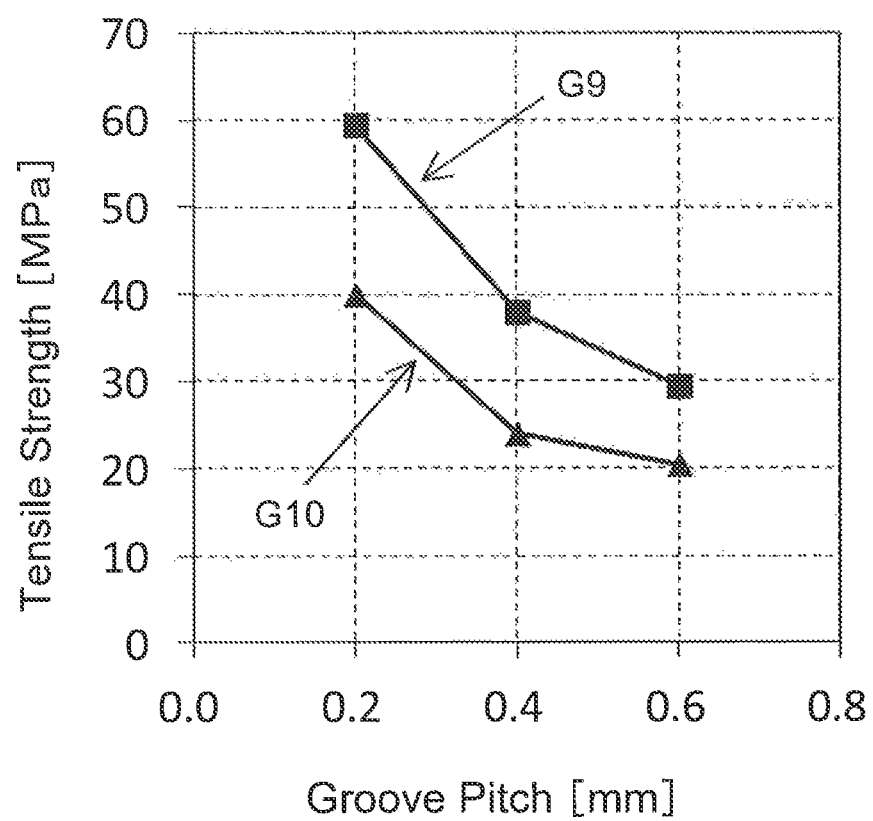
FIG. 11 is a graph showing an example of a relationship between groove pitch and tensile strength.

FIG. 11 is a graph showing an example of a relationship between groove pitch and tensile strength. Test pieces in which groove pitches Pt were 01 [mm], 0.4 [mm], and 0.6 [mm], respectively, were prepared, and the tensile strengths of the test pieces were measured. In each of the test pieces, the groove depth is 100 [μm]. The test temperature is 25 [° C.]. The line G9 indicates the results of the tests conducted on nickel test pieces, and the line G10 indicates the results of the tests conducted on uncoated test pieces. Both of the lines shows that a tensile strength of 20 [MPa] or higher is ensured. FIG. 10 shows that it is preferable that the groove pitch Pt be 0.2 [mm], 0.4 [mm], or 0.6 [mm].

The results shown in the graphs of FIGS. 9 to 11 indicate that it is preferable that the grooves that are provided in the high stress area HA satisfy the following conditions: (1) a depth of each of the grooves is equal to or greater than 25 [μm] and equal to or less than 100 [μm]; (2) pitches between adjacent grooves are 0.2 [mm], 0.4 [mm], or 0.6 [mm]; and (3) an area ratio of the plurality of grooves relative to an area of the high stress area HA is between 10% and 70%.

Figure 12:
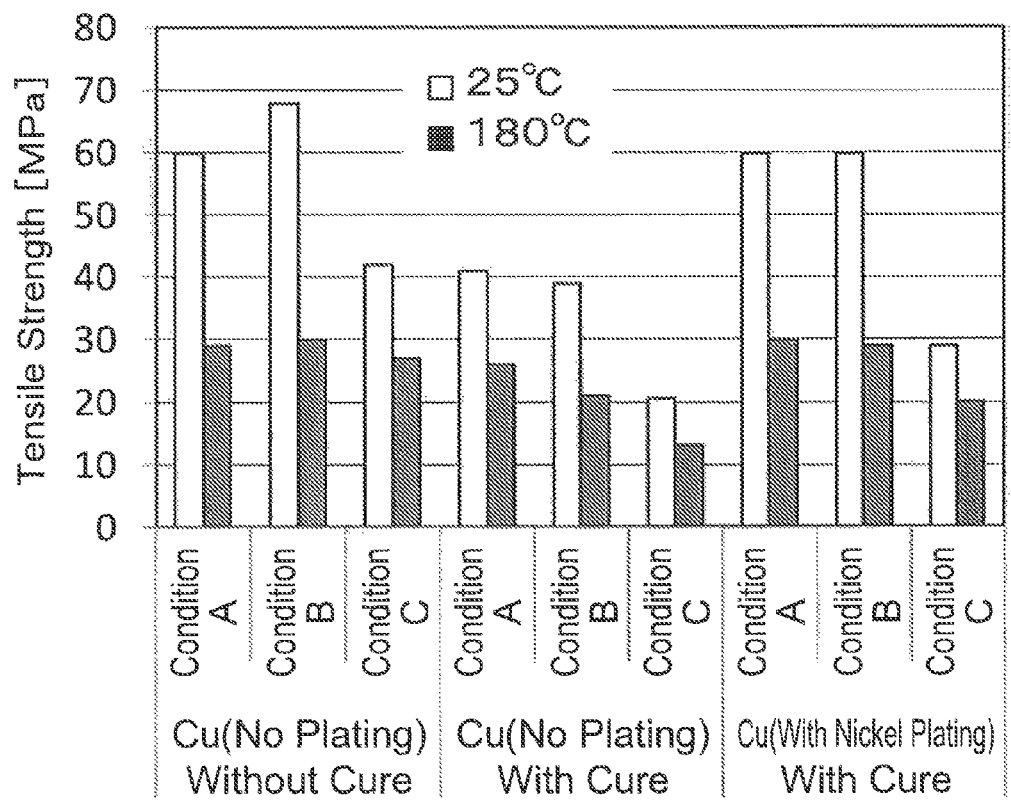
FIG. 12 is a graph showing an example of a relationship between differences in temperature among the grooves and tensile strength.

FIG. 12 is a graph showing experimental examples of comparisons between tensile strengths under several varying conditions. The caption "Cu (No Plating) Without Cure" refers to a test piece whose metal plate is made of an uncoated copper material and whose plastic is not subjected to heat curing. The caption "Cu (No Plating) With Cure" refers to a test piece whose metal plate is made of an uncoated copper material and whose plastic is subjected to heat curing. The caption "Cu (With Nickel Plating) With Cure" refers to a test piece whose metal plate is made of a copper material having a nickel-plated surface and whose plastic is subjected to heat curing. Further, the caption "Condition A" refers to a case where the grooves in a test piece are placed at pitches Pt of 0.2 [mm] and each have a depth Dt of 100 [μm]. Further, the caption "Condition B" refers to a case where the grooves in a test piece are placed at pitches Pt of 0.2 [mm] and each have a depth Dt of 50 [μm]. Further, the caption "Condition C" refers to a case where the grooves in a test piece are placed at a pitch Pt of 0.6 [mm] and each have a depth Dt of 100 [μm]. The white bars indicate results obtained in a case where the test temperature was set at 25 [MPa], and the gray bars indicate results obtained in a case where the test temperature was set at 180 [° C.]. In the cases of "Cu (No Plating) With Cure", the tensile strength was 20 [MPa] or higher, except for the cases of "Condition C" and the test temperature of 180 [° C.].

Figure 13:
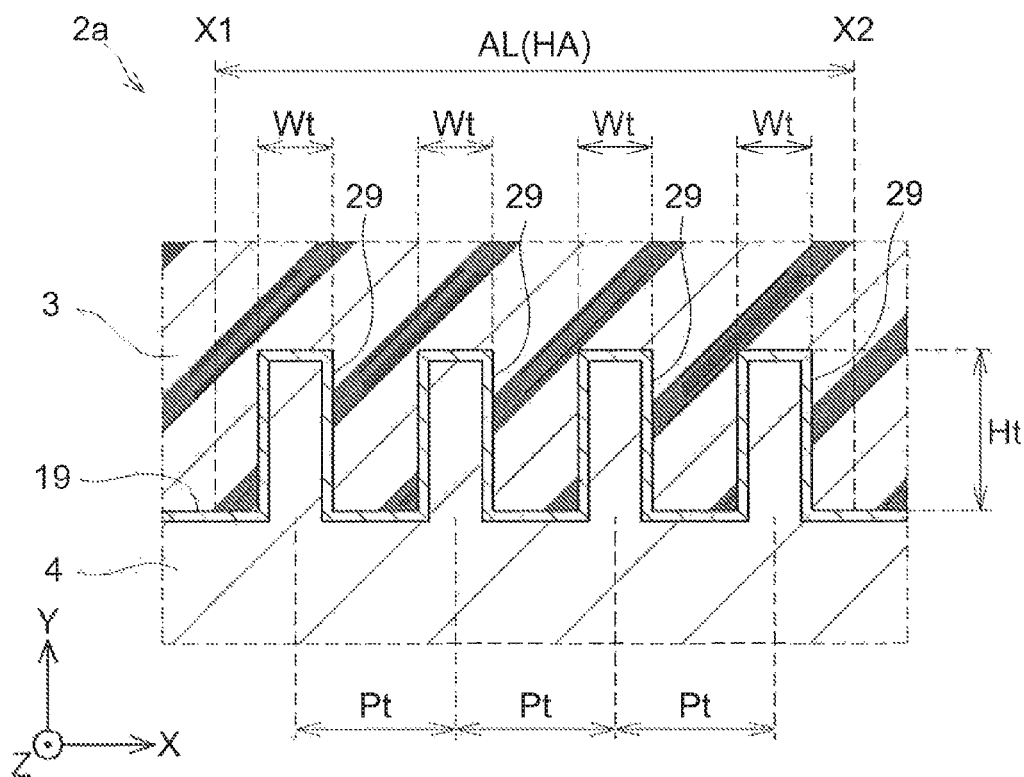
FIG. 13 is an enlarged cross-sectional view of a semiconductor device according to a modification.

The case where the grooves are provided in the high stress area HA has been described so far. Similar effects can be brought about by providing projections instead of the grooves. FIG. 13 is a partial cross-sectional view of a semiconductor device 2a according to a modification. The cross-sectional view of FIG. 13 is a cross-sectional view of the vicinity of the boundary between the heatsink plate 4 and the package 3 in the high stress area HA. In this semiconductor device 2a, a bonded surface of the heatsink plate 4 with the package 3 includes an area in which the tensile stress is equal to or higher than the threshold value Th, and a plurality of projections 29 are provided in the area. The plurality of projections 29 extend parallel to each other, and are formed so as to surround the transistor 12 in the plan view of the heatsink plate 4. Note, in this case, that in the plan view of FIG. 4, the group of rectangular lines indicated by the sign 9 corresponds to the projections. When the width Wt of each of the projections, the height Ht of each of the projections, the pitches Pt between the plurality of projections 29, and the ratio of the total area of the top surfaces of the projections to the area of the high stress area HA are under the same conditions as the grooves described above, the plurality of projections 29 improve the bonding force between the heatsink plate 4 and the package 3. Note that the height Ht of each of the projections 29 needs only be equal to the depth of each of the grooves 9. Note also that the ratio of the total area of the top surfaces of the projections to the area of the high stress area HA is a value obtained by dividing "width Wt of the top surface of each of the projections 29×number of projections 29" by the width AL of the high stress area HA.

Figure 14:
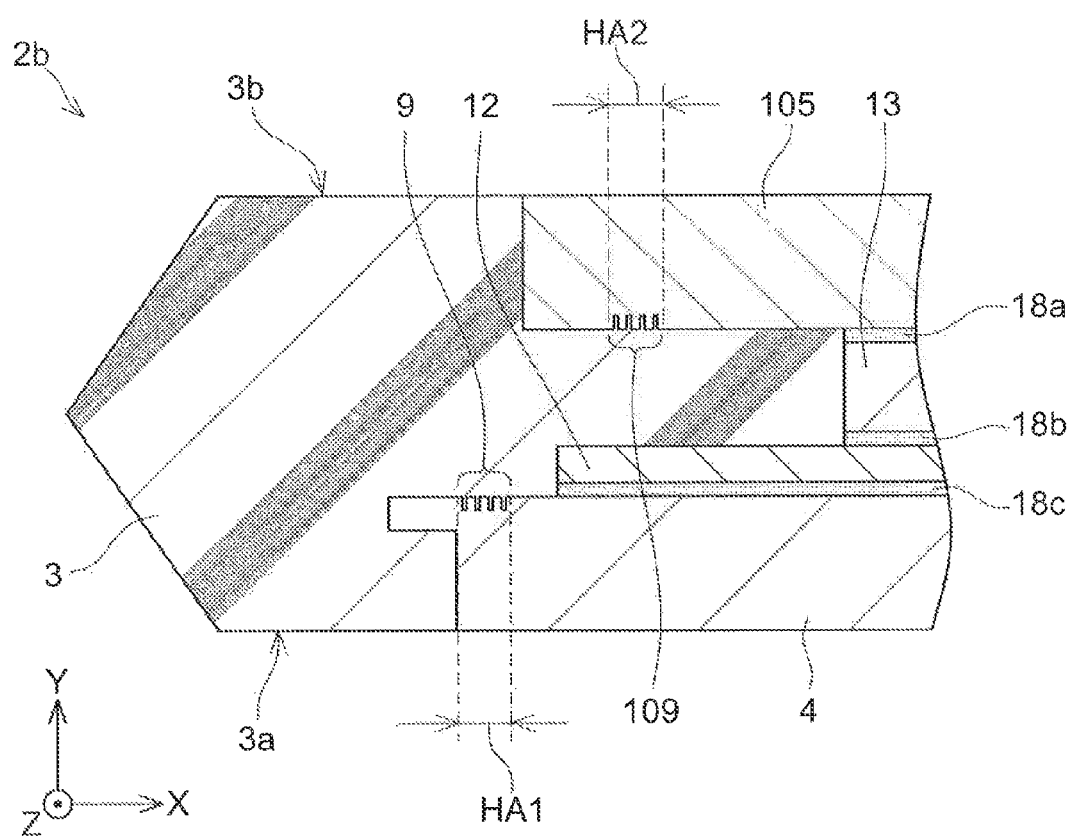
FIG. 14 is a partial cross-sectional view of a semiconductor device according to another modification.

FIG. 14 is a partial cross-sectional view of a semiconductor device 2b according to another modification. This semiconductor device 2b includes a transistor 12, a plastic package 3 in which the transistor 12 is embedded, a heatsink plate 4, and a heatsink plate 105. The heatsink plate 4 is bonded to a first surface 3a of the package 3, and is fixed directly to the transistor 12 in the package 3. The heatsink plate 105 is bonded to a second surface 3b of the package 3 so as to be opposed to the heatsink plate 4. The second surface 3b is opposite to the first surface 3a. The heatsink plate 105 is fixed to the transistor 12 via a spacer 13 in the package 3. Moreover, a bonded surface of the heatsink plate 4 with the package 3 includes a high stress area (i.e. an area indicated by the sign HA1 in the drawing), the high stress area has a possibility of generating tensile stress equal to or higher than a predetermined stress value, and a plurality of groove 9 are provided in the high stress area. Further, a bonded surface of the heatsink plate 105 with the package 3 includes a high stress area (i.e. an area indicated by the sign HA2 in the drawing), the high stress area has a possibility of generating tensile stress equal to or higher than a predetermined stress value, and a plurality of groove 109 are provided in the high stress area. Since the semiconductor device 2b includes the plurality of grooves in the high stress areas of both of the heatsink plates, the detachment of both of the heatsink plates can be suppressed.

Here are points to note about the technology described in the embodiment. In the embodiment, the plurality of grooves 9 are provided in the high stress area HA of the bonded surface of the heatsink plate 4 with the package 3. The plurality of grooves 9 extend parallel to each other, and surround the transistor 14 in the plan view of the heatsink plate 4. Alternatively, in a modification, the plurality of projections are provided in the high stress area of the heatsink plate 4. Similar effects can be brought about by providing a plurality of depressions and protrusions in the high stress area instead of the grooves or the projections. A plurality of grooves, a plurality of projections, or depressions and protrusions may be provided in a high stress area of another heatsink plate, as wells as the heatsink plate 4. The depressions are a kind of groove. That is, the "grooves" herein are not limited to elongated grooves but may be grooves that are short in length. Further, the semiconductor device disclosed herein may include both the depressions and the protrusions instead of including only either the grooves (depressions) or the protrusions. In the semiconductor device 2 according to the embodiment, the plurality of grooves are provided in the high stress area of the heatsink plate but are not provided in an area other than the high stress area. In terms of manufacturing cost, it is advantageous not to provide grooves in an area other than the high stress area. However, it is possible to provide grooves in an area other than the high stress area. The semiconductor device may include a plurality of grooves placed at first pitches and a plurality of grooves placed at second pitches. Note here that the second pitches may be different from the first pitches. The first pitches and the second pitches may be 0.2 mm, 0.4 mm, or 0.6 mm. The semiconductor device may further include a plurality of grooves placed at third pitches. The third pitches may be different from the first pitches and the second pitches. The third pitches, too, may be 0.2 mm, 0.4 mm, or 0.6 mm.

The transistors 12 and 14 and the diodes 16 and 17 according to the embodiment correspond to examples of the semiconductor elements. The heatsink plate 4 corresponds to an example of the first heatsink plate, and the heatsink plate 5 corresponds to an example of the second heatsink plate. The threshold value Th corresponds to the predetermined value. The package 3 corresponds to an example of the plastic body. One of the principal flat surfaces, namely the principal flat surface 3a, of the package 3 corresponds to an example of the first surface, and the other of the principal flat surfaces, namely the principal flat surface 3b, of the package 3 corresponds to an example of the second surface.

In the semiconductor device 2 according to the embodiment, the two heatsink plates (i.e. the heatsink plate 4 and the heatsink plate 5) are opposed to each other with the semiconductor element (transistor 12) sandwiched therebetween. One of the heatsink plates, namely the heatsink plate 4, is fixed directly to the semiconductor element, and the other of the heatsink plates, namely the heatsink plate 5, is fixed to the semiconductor element via the spacer 13. Moreover, the plurality of grooves 9 are provided in the heatsink plate 4. In this structure, the heatsink plate 4 conducts heat from the semiconductor element more easily than the heatsink plate 5. Therefore, the heatsink plate 4 may be detached more easily than the heatsink plate 5. This structure provides the grooves in the more easily detachable one of the two heatsink plates, thus making it possible to suppress the occurrence of detachment.

In the semiconductor device 2b according to the modification, the two heatsink plates (i.e. the heatsink plate 4 and the heatsink plate 105) are opposed to each other with the semiconductor element (transistor 12) sandwiched therebetween. One of the heatsink plates, namely the heatsink plate 4, is fixed directly to the semiconductor element, and the other of the heatsink plates, namely the heatsink plate 105, is fixed to the semiconductor element via the spacer 13. Moreover, the plurality of grooves 9 are provided in the heatsink plate 4, and the plurality of grooves 109 are provided in the heatsink plate 105. This structure makes it possible to suppress the occurrence of detachment of both of the heatsink plates.

In a case where a plurality of grooves, a plurality of protrusions, or both of the plurality of grooves and the plurality of protrusions are provided in either of the two heatsink plates opposed to each other, the plurality of grooves, the plurality of protrusions, or both of the plurality of grooves and the plurality of protrusions are provided not in the heatsink plate fixed to the semiconductor element via the spacer but in the heatsink plate fixed directly to the semiconductor element. In the semiconductor device 2 according to the embodiment, the plurality of grooves 9 are provided not in the heatsink plate 5 fixed to the semiconductor element via the spacer 13 but in the heatsink plate 4 fixed directly to the semiconductor element. A reason for this is as follows. To help comprehension, the following description refers to the signs used for the semiconductor device 2 according to the embodiment. In each of the heatsink plates 4 and 5 opposed to each other, as shown in FIG. 5, stress that is generated in the heatsink plate is great in the vicinity of an edge of the heatsink plate and becomes smaller toward the center of the heatsink plate. Since the semiconductor element contains silicon, there is a large difference in coefficient of linear expansion around the semiconductor element. Therefore, it is preferable that a plurality of grooves, a plurality of protrusions, or both of the plurality of grooves and the plurality of protrusions be provided in the heatsink plate 4 fixed directly to the semiconductor element. Meanwhile, the spacer 13 is made of copper. Therefore, the difference in coefficient of linear expansion is smaller on the side of the heatsink plate 5 fixed to the semiconductor element via the spacer 13 than on the side of the heatsink plate 4. Accordingly, stress that is generated in the heatsink plate 5 is lower than stress that is generated in the heatsink plate 4. Furthermore, even if the heatsink plate 5 fixed to the semiconductor element via the spacer 13 may be detached from the package 3, such detachment has less effect on the semiconductor element than detachment of the heatsink plate 4. Specifically, the presence of the spacer 13 between the heatsink plate 5 and the package 3 prevents the boundary of detachment between the heatsink plate 5 and the package 3 from directly reaching the semiconductor element. Therefore, no outer material enters the semiconductor element through the place of detachment, nor is any effect exerted on a distortion (solder distortion) of the bonding layers 18b and 18c (see FIG. 3) on both surfaces of the semiconductor element.

In the technology disclosed herein, both of the two heatsink plates opposed to each other may be fixed directly to the semiconductor element, and a plurality of grooves, a plurality of protrusions, or both of the plurality of grooves and the plurality of protrusions may be provided in either or both of the heatsink plates. Alternatively, in the technology disclosed herein, both of the two heatsink plates opposed to each other may be fixed directly to the semiconductor element via other members (e.g. metal spacers or metal blocks), and a plurality of grooves, a plurality of protrusions, or both of the plurality of grooves and the plurality of protrusions may be provided in either or both of the heatsink plates.

In the semiconductor device 2, as shown in FIG. 2, the heatsink plate 4 has a larger cross-sectional area than the heatsink plate 5, and the heatsink plate 4 is exposed from the package 3 (body) by a larger area than the heatsink plate 5. Moreover, the plurality of grooves 9 are provided in the heatsink plate 4, which has a larger cross-sectional area (i.e. which is exposed by a larger area). Alternatively, the two heatsink plates opposed to each other may have different cross-sectional areas (i.e. may be exposed from the body by different areas), and a plurality of grooves, a plurality of protrusions, or both of the plurality of grooves and the plurality of protrusions may be provided in that one of the two heatsink plates which has a smaller cross-sectional area (i.e. which is exposed by a smaller area). Alternatively, the two heatsink plates opposed to each other may have the same size, and a plurality of grooves, a plurality of protrusions, or both of the plurality of grooves and the plurality of protrusions may be provided in either or both of the heatsink plates.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
   a semiconductor element;
   a plastic body in which the semiconductor element is embedded;
   a first heatsink plate bonded to a first surface of the plastic body, the first heatsink plate being fixed to the semiconductor element in the plastic body; and
   a second heatsink plate bonded to a second surface of the plastic body so as to be opposed to the first heatsink plate, the second heatsink plate being fixed to the semiconductor element in the plastic body, and the second surface being opposite to the first surface,
   wherein a bonded surface of the first heatsink plate with the plastic body comprises a high stress area,
   the high stress area has a possibility of generating tensile stress equal to or higher than a predetermined stress value, and
   a plurality of grooves, a plurality of protrusions, or both of the plurality of grooves and the plurality of protrusions are provided in the high stress area.

2. The semiconductor device according to claim 1, wherein
   the first heatsink plate is made of a copper plate coated by nickel plating, and
   the predetermined stress value is 5 [MPa].

3. The semiconductor device according to claim 1, wherein
   the first heatsink plate is made of an uncoated copper plate, and
   the predetermined stress value is 10 [MPa].

4. The semiconductor device according to claim 1, wherein
   the plurality of grooves is provided at the high stress area,
   a depth of each of the grooves is equal to or greater than 25 μm and equal to or less than 100 μm,
   pitches between adjacent grooves are 0.2 mm, 0.4 mm, or 0.6 mm, and
   an area ratio of the plurality of grooves relative to the high stress area is between 10% and 70%.

5. The semiconductor device according to claim 1, wherein the plurality of grooves, the plurality of protrusions, or both of the plurality of grooves and the plurality of protrusions are provided so as to surround the semiconductor element in a plan view of the first heatsink plate.

\* \* \* \* \*